United States Patent
Choi et al.

(10) Patent No.: US 7,282,421 B2
(45) Date of Patent: Oct. 16, 2007

(54) METHODS FOR REDUCING A THICKNESS VARIATION OF A NITRIDE LAYER FORMED IN A SHALLOW TRENCH ISOLATION CMP PROCESS AND FOR FORMING A DEVICE ISOLATION FILM OF A SEMICONDUCTOR DEVICE

(75) Inventors: Yong Soo Choi, Gyeonggi-do (KR); Hyuk Kwon, Seoul (KR); Sang Hwa Lee, Gyeonggi-do (KR); Geun Min Choi, Gyeonggi-do (KR); Yong Wook Song, Seoul (KR); Gyu Han Yoon, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 345 days.

(21) Appl. No.: 10/998,809

(22) Filed: Nov. 30, 2004

(65) Prior Publication Data

US 2006/0035465 A1    Feb. 16, 2006

(30) Foreign Application Priority Data

Aug. 11, 2004    (KR) .................. 10-2004-0063168

(51) Int. Cl.
*H01L 21/76* (2006.01)
(52) U.S. Cl. ................... 438/401; 257/797; 438/975
(58) Field of Classification Search ......... 438/401.975; 257/797
See application file for complete search history.

(56) References Cited

U.S. PATENT DOCUMENTS 5,017,514 A * 5/1991 Nishimoto .................. 438/14
6,703,287 B2 * 3/2004 Fujiishi et al. .............. 438/427

OTHER PUBLICATIONS

Hyuk Kwon et al., "WID Rnit Variation Improvements for HSS STI CMP Process Using Modified Scribe Lane Pattern Design", Mat. Res. Sco. Symp. Proc., 2004, pp. K9.3.1-K9.3.6, vol. 816.

* cited by examiner

*Primary Examiner*—Asok Kumar Sarkar
(74) *Attorney, Agent, or Firm*—Townsend and Townsend and Crew LLP

(57) ABSTRACT

A method for reducing a thickness variation of a nitride layer in a shallow trench isolation (STI) CMP process is provided, the method including forming an active region pattern in an alignment key region of a scribe lane where a device isolation film is formed at an ISO level, and forming a dummy active region pattern substantially adjacent to a vernier key pattern in the scribe lane during formation of the vernier key pattern, wherein the dummy active region pattern is spaced apart from the vernier key pattern by a known distance. Preferably, the active region pattern and the dummy active region pattern are formed prior to the STI CMP process.

15 Claims, 5 Drawing Sheets

METHODS FOR REDUCING A THICKNESS VARIATION OF A NITRIDE LAYER FORMED IN A SHALLOW TRENCH ISOLATION CMP PROCESS AND FOR FORMING A DEVICE ISOLATION FILM OF A SEMICONDUCTOR DEVICE

CORRESPONDING RELATED APPLICATIONS

This application claims the benefit of and priority to Korean patent application no. KR2004-63168, filed on Aug. 11, 2004, the entire contents of which are incorporated by reference herein in its entirety.

BACKGROUND OF THE INVENTION

1. Field of the Invention

The present invention generally relates to a method for reducing a thickness variation of a remaining nitride layer in a shallow trench isolation (STI) CMP process, and more specifically, to a method for reducing a thickness variation of a remaining nitride layer in an STI CMP process by inserting one or more predetermined active region patterns in a scribe lane for adjusting active region pattern density in a wafer.

2. Description of the Related Art

One method for forming a device isolation film of a semiconductor device is depicted in FIG. 1. As shown, a pad oxide layer 20 and a pad nitride layer 30 are formed over a semiconductor substrate 10. The pad nitride layer 30, the pad oxide layer 20, and a predetermined thickness of the semiconductor substrate 10 where a device isolation film is to be formed are etched to form a trench (not shown).

Next, an oxide film 40 (for a device isolation film) is deposited to fill the trench. The oxide film 40 deposited in the trench is then polished via a CMP process to expose the pad nitride layer 30.

In the CMP process, a High Selectivity Slurry ("HSS") is used. As shown in FIG. 2, the thickness ($t_N$) of a remaining pad nitride layer 30 varies depending on the positions Specifically, FIG. 2 depicts five different positions C, C1, C2, C3 and C4 in a die. FIG. 3 is a graph illustrating the thickness of the remaining pad nitride layer 30 after the STI CMP process according to the position in the die. As shown in FIGS. 2 and 3, the thickness of the remaining pad nitride layer 30 ($R_{nit}$) varies according to the position in the die as indicated in FIG. 2. This variation is due, in part, to variation in the density of active region in C, C1, C2, C3, C4, and their adjacent regions.

As illustrated in FIG. 4, when the thickness of a remaining pad nitride layer 30 in the die varies, the depths of moat 50 generated in a cleaning process for the pad nitride layer 30 varies according to the position in the die. This phenomenon increases a cell threshold voltage and decreases a process margin, thereby resulting in a deterioration of device characteristics.

SUMMARY OF THE INVENTION

Accordingly, it is an object of the present invention to reduce thickness variation of a remaining nitride layer in an STI CMP process wherein an active region pattern is inserted in a scribe lane to increase the overall density of the active region, thereby reducing the thickness variation of a remaining pad nitride layer after the STI CMP process and reducing moat depth variation occurring in a cleaning process of the pad nitride layer.

One embodiment of the present invention includes a method for reducing a thickness variation of a nitride layer in a STI CMP process, the method including forming an active region pattern in an alignment key region of a scribe lane where a device isolation film is formed at an ISO level, and forming a dummy active region pattern substantially adjacent to a vernier key pattern in the scribe lane during formation of the vernier key pattern, wherein the dummy active region pattern is spaced apart from the vernier key pattern by a known distance. Preferably, the active region pattern and the dummy active region pattern are formed prior to the STI CMP process.

Another embodiment of the present invention includes a method for forming a device isolation film of a semiconductor device, the method including forming a pad oxide layer and a pad nitride layer over a semiconductor substrate, etching a predetermined region of the pad nitride layer, the pad oxide layer, and a predetermined thickness of a first portion of the semiconductor substrate to form a trench, wherein a second portion of the semiconductor substrate is not etched so that an dummy active region pattern having a matrix form remains, depositing an oxide film for a device isolation film to substantially fill the trench, and polishing the oxide film to substantially expose the pad nitride layer. Preferably, the second portion of the semiconductor substrate corresponds to a region in a scribe lane where an alignment key is to be formed and a region adjacent to a vernier key in the scribe lane.

DETAILED DESCRIPTION OF THE EXEMPLARY EMBODIMENTS

A method for reducing a thickness variation of a remaining nitride layer in an STI CMP process in accordance with an embodiment of the present invention will now be described in detail with reference to the accompanying drawings. Wherever possible, the same reference numbers will be used throughout the drawings to refer to the same or like parts.

Figure 1:
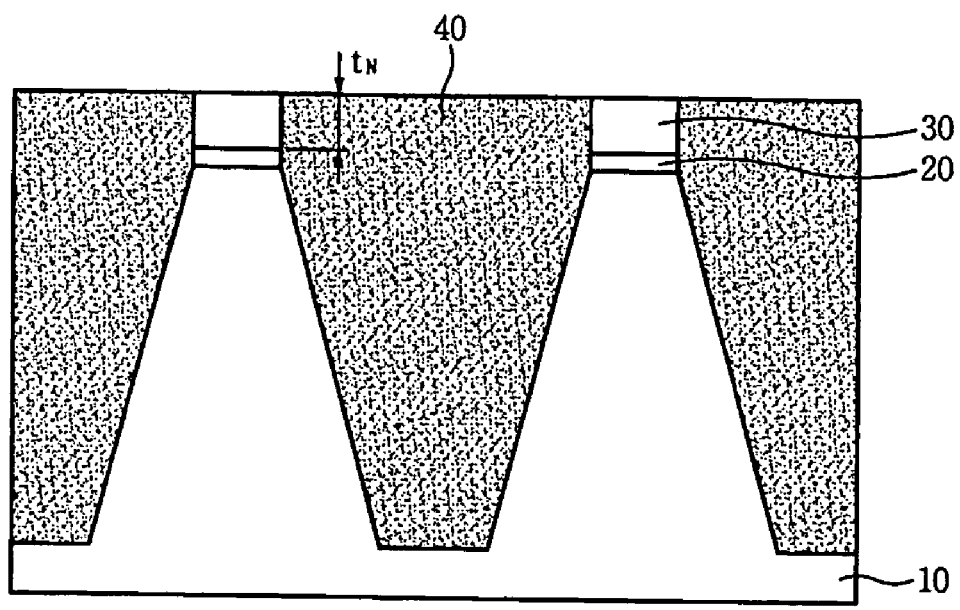
FIG. 1 is a cross-sectional view illustrating a remaining pad nitride layer on a semiconductor substrate after a STI CMP process.
Figure 2:
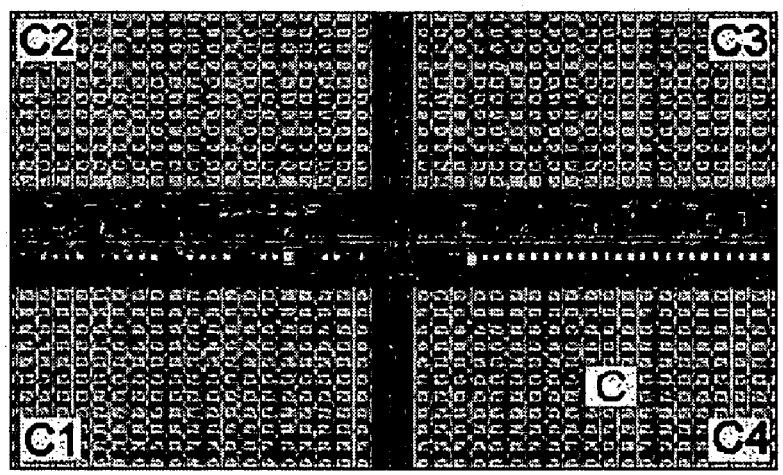
FIG. 2 is an illustration indicating five positions in a die after an STI CMP process.
Figure 3:
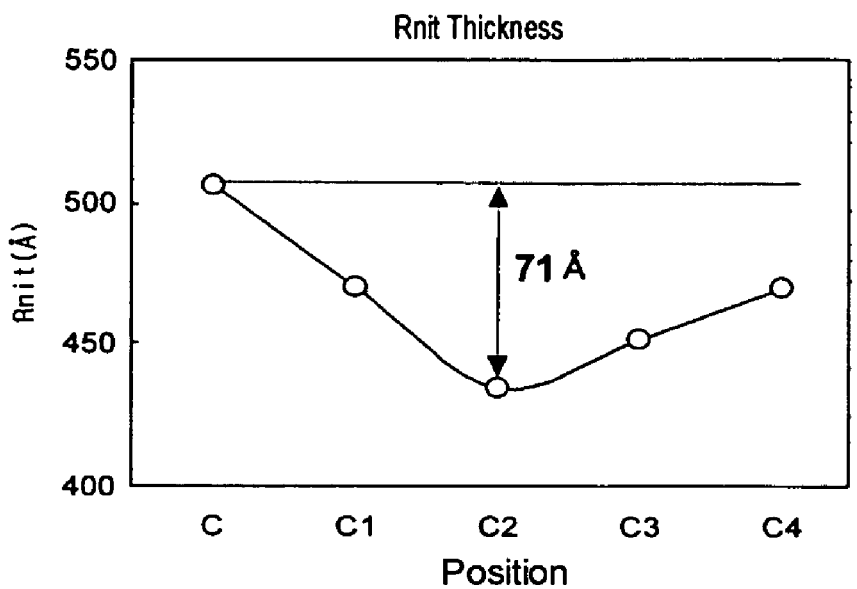
FIG. 3 is a graph illustrating the thickness of a remaining pad nitride layer according to the positions indicated in FIG. 2.
Figure 4:
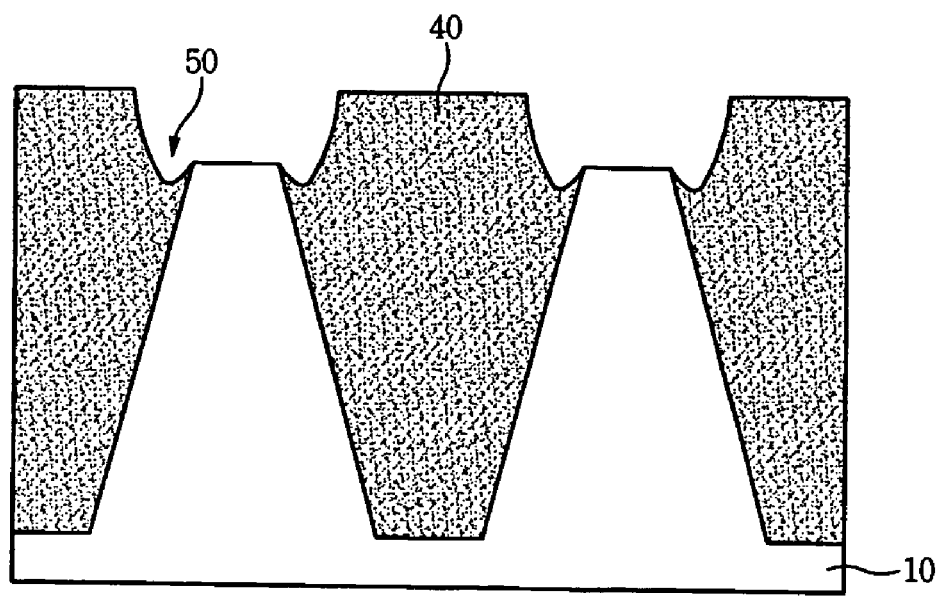
FIG. 4 is a cross-sectional view illustrating a moat generated during the cleaning process of the remaining pad nitride layer.
Figure 5:
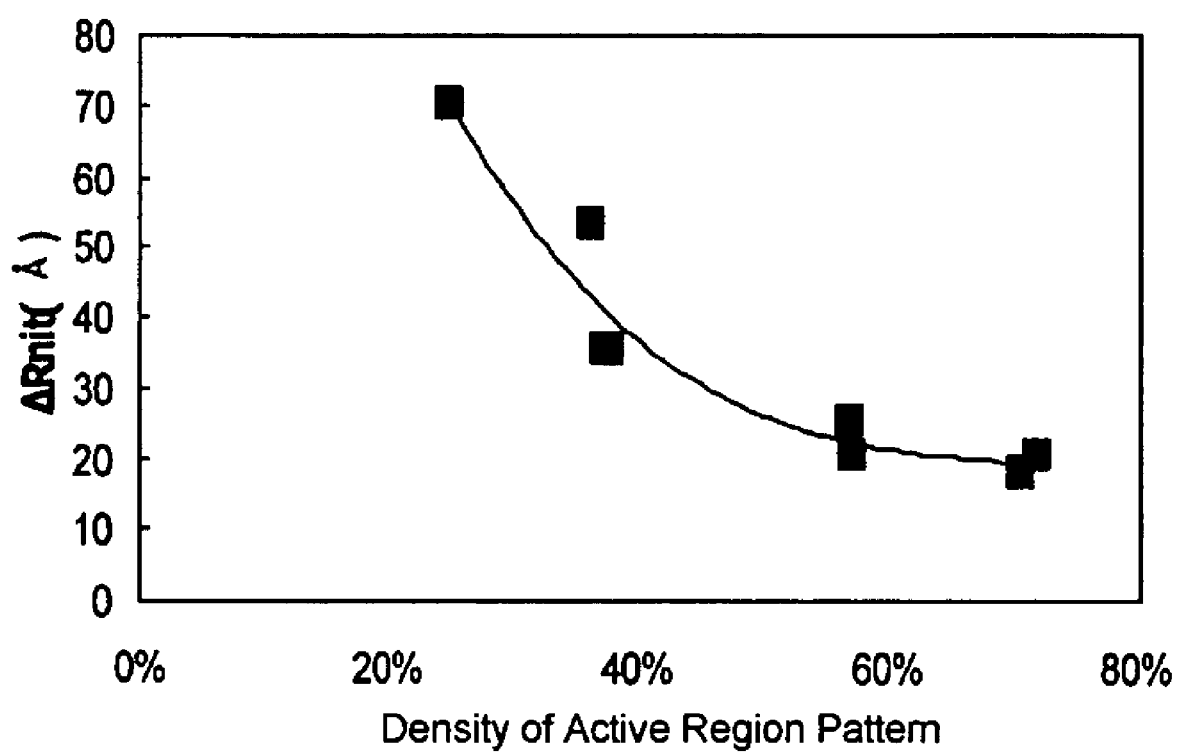
FIG. 5 is a graph illustrating the relation between the density of active region pattern and $\Delta R_{nit}$ in a cell region and its adjacent regions.

FIG. 5 is a graph illustrating the relation between the density of active region pattern and $\Delta R_{nit}$ in a cell region and its adjacent regions, where $\Delta R_{nit}$ denotes a difference between a thickness of remaining nitride layers in a center position of a cell region and that in a corner position of the cell region.

As shown in FIG. 5, as the density of the active region, i.e. area occupied by the active region per unit area, in a cell region and its adjacent region increases, $\Delta R_{nit}$ decreases. Particularly, in case where the density of active region is over about 60%, the thickness of a remaining nitride layer is more uniform.

Various embodiments of the present invention employs the above characteristics, wherein the thickness of the remaining nitride layer is substantially uniformly maintained when the density of active region is high. In accordance with an embodiment of the present invention, this is achieved by increasing the active pattern density in a cell region.

Figure 6:
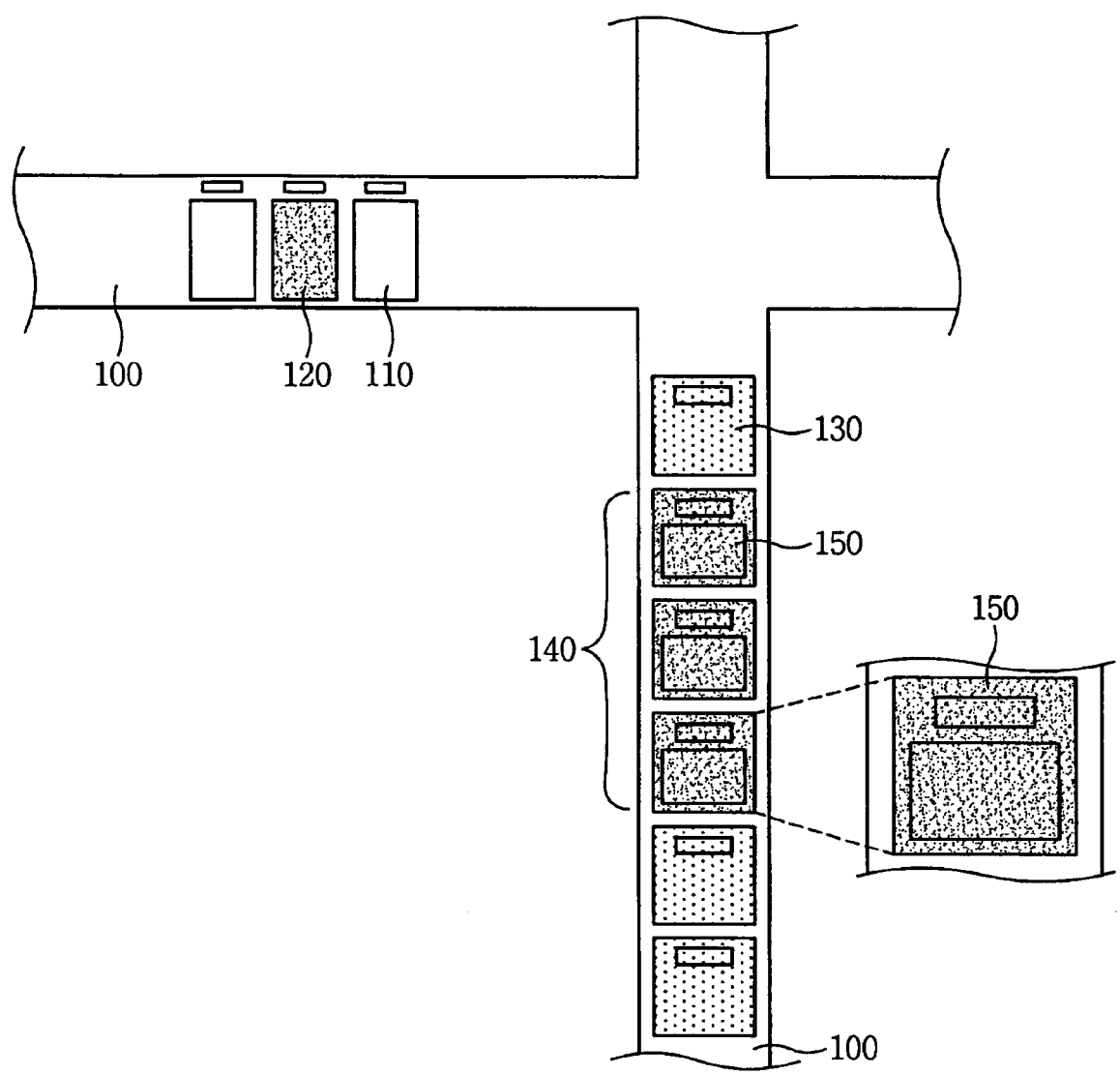
FIG. 6 is a schematic diagram illustrating an alignment key formed in a scribe lane according to an embodiment of the present invention.

FIG. 6 is a schematic diagram illustrating an alignment key formed in a scribe lane according to an embodiment of the present invention.

Referring to FIG. 6, a scribe lane 100, which is located between two neighboring dies, includes various alignment keys. Conventionally, the region where an alignment key is not formed at an ISO level is filled with a device isolation film. An "ISO level" refers to a level or a step wherein a device isolation film is formed.

In accordance with an embodiment of the present invention, however, the region in the scribe lane where an alignment key is not formed at ISO level is filled with an active region pattern instead of a device isolation film.

Specifically, region 110 in the scribe lane 100 denotes a region where an alignment key pattern is formed in the ISO level. Region 120 denotes a region where an alignment key pattern is to be formed in a subsequent process but not at the ISO level. An active region pattern is inserted in the region 120 at the ISO level.

Similarly, region 130 in the scribe lane 100 is a region where an alignment key pattern is formed at the ISO level while region 140 is a region where an alignment key is not formed at the ISO level, which is filled with a device isolation film in accordance with the prior art. In accordance with an embodiment of the present invention, an active region pattern is inserted in the region 140. Preferably, the inserted active region pattern has substantially the same shape as the alignment key pattern formed in the subsequent process.

Figure 7:
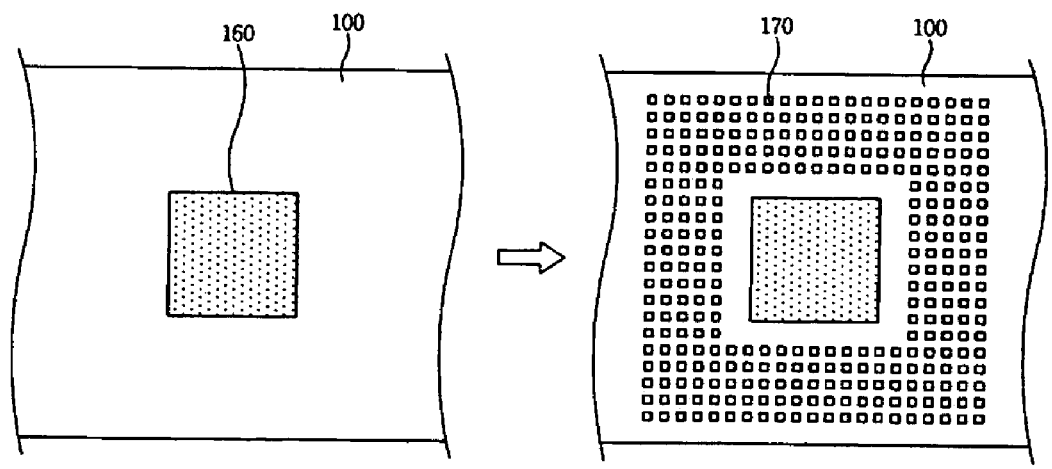
FIG. 7 is a top view of a vernier key pattern before and after performing an embodiment of the present invention.

FIG. 7 is a top view of a vernier key pattern before and after performing an embodiment of the present invention.

Referring to FIG. 7, an adjacent region of a vernier key pattern 160 in the scribe lane 100 is filled with a device isolation film. In accordance with an embodiment of the present invention, a plurality of dummy active region patterns 170 spaced apart from the vernier key pattern 160 by a known distance are inserted in the substantially adjacent region of the vernier key pattern 160.

Each of the plurality of dummy active region patterns 170 preferably has one of a substantially circular shape and a substantially square shape, though other shapes are also contemplated. The plurality of dummy active region patterns are arranged in a matrix form and have a sufficiently small dimension so as to not significantly optically interfere with the vernier key pattern 160. For example, a width of each dummy active region pattern 170 may be less than or equal to about 0.7 μm, and a distance between the dummy active region patterns 170 is preferably greater than or equal to about 0.3 μm. In addition, it is preferable that the dummy active pattern 170 is spaced apart from the vernier key pattern 170 by a distance greater than or equal to about 5 μm.

A method for reducing a thickness variation of a remaining nitride layer in accordance with another embodiment of the present invention will now be described.

First, a pad oxide layer and a pad nitride layer are sequentially formed over a semiconductor substrate.

Thereafter, the pad nitride layer, the pad oxide layer, and a predetermined thickness of a first portion of the semiconductor substrate where a device isolation film is to be formed are etched. Preferably, a second portion of the semiconductor substrate is not etched, the second portion corresponding to a region where an alignment key pattern including a vernier key is to be formed in a scribe lane.

In the etch process, the semiconductor substrate is etched in a manner that a dummy active region pattern is in a matrix form spaced apart from a vernier key pattern by a known distance.

Thereafter, an oxide film for device isolation is formed on the semiconductor substrate to fill up the trench. The oxide film is then polished until the pad nitride layer is exposed.

In accordance with the above process, an active region is formed in a predetermined region in the scribe lane and in a cell region. Other regions are filled with the oxide film, i.e. a device isolation film.

Accordingly, as illustrated in FIG. 6 and FIG. 7, when an active region pattern is formed in predetermined regions in the scribe lane, pattern density of active region per unit area in a wafer may be increased within a range of about 45% to about 55%. Therefore, a thickness variation of a remaining nitride layer according to the positions in the cell region may be decreased in a subsequent STI CMP process. That is, the thickness of the remaining nitride layer is substantially uniform regardless of the positions.

Figure 8:
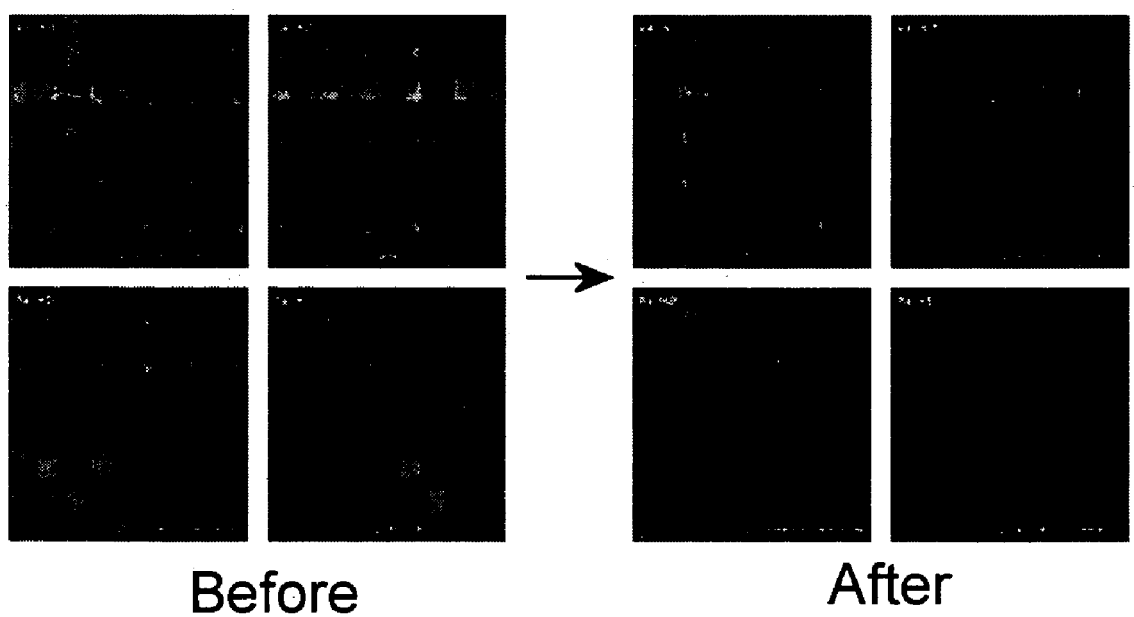
FIG. 8 is an illustration of a scribe lane before and after performing an embodiment of the present invention.

FIG. 8 is an illustration of a scribe lane before and after performing an embodiment of the present invention.

The white region of FIG. 8 denotes a device isolation film pattern and the black region denotes an active region pattern. As illustrated in FIG. 8, when an embodiment of the present invention is applied, the pattern density of active region can be increased.

As described above, a method for reducing a thickness variation of a remaining nitride layer according to an embodiment of the present invention reduces moat depth variation occurring in the cleaning process of a pad nitride layer by decreasing the difference in thickness of the remaining pad nitride layer after a CMP process. This is achieved by substituting an active region pattern for a device isolation film pattern formed in the scribe lane.

As the present invention may be embodied in several forms without departing from the spirit or scope thereof, it should also be understood that the above-described embodiments are not limited by any of the details of the foregoing description. Rather the present invention should be construed broadly as defined in the appended claims. All changes and modifications that fall within the metes and bounds of the claims, or equivalences of such metes and bounds are intended to be embraced by the appended claims.

What is claimed is:

1. A method for reducing a thickness variation of a nitride layer in a shallow trench isolation (STI) CMP process, comprising:
    forming an active region pattern in an alignment key region of a scribe lane where a device isolation film is formed at an ISO level; and
    forming a dummy active region pattern substantially adjacent to a vernier key pattern in the scribe lane during formation of the vernier key pattern, wherein the dummy active region pattern is spaced apart from the vernier key pattern by a known distance, and wherein the active region pattern and the dummy active region pattern are formed prior to the STI CMP process.

2. The method according to claim 1, wherein the dummy active region pattern comprises a plurality of active region patterns arranged in matrix form, and having one of a substantially circular shape and a substantially square shape.

3. The method according to claim 1, wherein the dummy active region pattern is spaced apart from the vernier key pattern by a distance of at least about 5 µm.

4. The method according to claim 1, wherein a pattern density of active region per unit area in a wafer is within a range of about 45% to about 55% after the active region pattern and the dummy active region pattern are formed.

5. The method according to claim 1, wherein the dummy active region pattern has a dimension not greater than about 0.7 µm, and a distance between the dummy active region patterns is at least about 0.3 µm.

6. The method according to claim 1, wherein the active region pattern has substantially the same shape as an alignment key pattern.

7. A method for forming a device isolation film of a semiconductor device, the method comprising:
   (a) forming a pad oxide layer and a pad nitride layer over a semiconductor substrate;
   (b) etching a predetermined region of the pad nitride layer, the pad oxide layer, and a predetermined thickness of a first portion of the semiconductor substrate to form a trench, wherein a second portion of the semiconductor substrate is not etched so that a dummy active region pattern having a matrix form remains;
   (c) depositing an oxide film for a device isolation film to substantially fill the trench; and
   (d) polishing the oxide film to substantially expose the pad nitride layer,
   wherein the second portion of the semiconductor substrate corresponds to a region in a scribe lane where an alignment key is to be formed and a region adjacent to a vernier key in the scribe lane.

8. A semiconductor fabrication process, comprising:
   forming a pad oxide layer and a pad nitride layer on a substrate;
   etching the pad nitride layer, the pad oxide layer, and a predetermined thickness of the semiconductor substrate to form a trench;
   depositing an oxide film within the trench; and
   polishing the oxide film to expose at least part of the pad nitride layer;
   wherein the semiconductor substrate is etched such that a dummy active region pattern is formed and spaced apart from a vernier key pattern by a known distance.

9. The process according to claim 8, wherein the pad oxide layer and the pad nitride layer are sequentially formed over the semiconductor substrate.

10. The process according to claim 8, wherein only a portion of the semiconductor substrate is etched such that an active region pattern in an alignment key region remains.

11. The process according to claim 8, wherein the dummy active region pattern is spaced apart from the vernier key pattern by at least about 5 µm.

12. The process according to claim 8, wherein the dummy active region pattern includes a plurality of active region patterns.

13. The process according to claim 12, wherein a distance between the dummy active region patterns is at least about 0.3 µm.

14. The process according to claim 12, wherein a width of each dummy active region pattern is not greater than about 0.7 µm.

15. The process according to claim 12, wherein each dummy active region pattern has one of a substantially circular shape and a substantially square shape.

* * * * *